United States Patent
Lambert et al.

(10) Patent No.: US 7,707,534 B2
(45) Date of Patent: Apr. 27, 2010

(54) CIRCUIT BOARD DESIGN TOOL AND METHODS

(75) Inventors: Timothy M. Lambert, Austin, TX (US); Bianca Roxana Tudosa, Austin, TX (US)

(73) Assignee: Dell Products, LP, Round Rock, TX (US)

( * ) Notice: Subject to any disclaimer, the term of this patent is extended or adjusted under 35 U.S.C. 154(b) by 286 days.

(21) Appl. No.: 11/782,743

(22) Filed: Jul. 25, 2007

(65) Prior Publication Data

US 2009/0031272 A1     Jan. 29, 2009

(51) Int. Cl.
*G06F 17/50* (2006.01)
(52) U.S. Cl. .................... 716/11; 716/15; 716/4
(58) Field of Classification Search .............. 716/11, 716/15, 4
See application file for complete search history.

(56) References Cited

U.S. PATENT DOCUMENTS

| | | | |
|---|---|---|---|
| 6,438,729 B1 * | 8/2002 | Ho ................................ 716/1 |
| 6,470,482 B1 * | 10/2002 | Rostoker et al. ................ 716/6 |
| 7,146,594 B1 * | 12/2006 | Goike et al. ................... 716/11 |
| 7,240,318 B2 * | 7/2007 | Ito et al. ........................ 716/11 |
| 7,281,232 B1 * | 10/2007 | Nicolino et al. ............... 716/12 |
| 7,418,683 B1 * | 8/2008 | Sonnard et al. ................ 716/5 |
| 7,458,055 B2 * | 11/2008 | Bentley et al. ................ 716/15 |
| 2002/0042904 A1 * | 4/2002 | Ito et al. ........................ 716/8 |
| 2003/0182640 A1 * | 9/2003 | Alani et al. .................... 716/4 |
| 2004/0148582 A1 * | 7/2004 | Ito et al. ........................ 716/8 |
| 2004/0153988 A1 * | 8/2004 | Ito et al. ........................ 716/11 |
| 2005/0080502 A1 * | 4/2005 | Chernyak et al. ............. 700/97 |
| 2005/0108663 A1 * | 5/2005 | Bentley et al. ................ 716/1 |
| 2005/0246672 A1 * | 11/2005 | Bois et al. ...................... 716/5 |
| 2006/0282811 A1 * | 12/2006 | Fujimura ...................... 716/15 |

* cited by examiner

*Primary Examiner*—Phallaka Kik
(74) *Attorney, Agent, or Firm*—Larson Newman & Abel. LLP

(57) ABSTRACT

A design tool for printed circuit boards displays a graphical representation of a printed circuit board layout through a graphical user interface (GUI). Comments for particular components of the printed circuit board layout can be entered through the graphical user interface. The comments are stored in a data file associated with the printed circuit board layout. Comments can be entered and viewed by multiple users in real time. Comments can be displayed through the graphical user interface in proximity to the component associated with the comment, thereby improving the efficiency with which designers can review and implement suggested changes to the PCB layout.

20 Claims, 3 Drawing Sheets

CIRCUIT BOARD DESIGN TOOL AND METHODS

FIELD OF THE DISCLOSURE

The present disclosure relates to printed circuit boards and more particularly to layout tools for printed circuit boards.

BACKGROUND

As the value and use of information continues to increase, individuals and businesses seek additional ways to process and store information. One option is an information handling system. An information handling system generally processes, compiles, stores, and/or communicates information or data for business, personal, or other purposes. Because technology and information handling needs and requirements may vary between different applications, information handling systems may also vary regarding what information is handled, how the information is handled, how much information is processed, stored, or communicated, and how quickly and efficiently the information may be processed, stored, or communicated. The variations in information handling systems allow for information handling systems to be general or configured for a specific user or specific use such as financial transaction processing, airline reservations, enterprise data storage, or global communications. In addition, information handling systems may include a variety of hardware and software components that may be configured to process, store, and communicate information and may include one or more computer systems, data storage systems, and networking systems.

Printed circuit boards (PCBs) are used in many information handling systems and other electronic devices. The layout of a PCB is designed so that the PCB can fit within the physical dimensions of the electronic device and also so that the PCB can perform its designed functions. Frequently multiple designers are involved in design of the PCB layout. Layout design software tools can be employed by each designer to propose the layout for a portion of the PCB board. A design review process is typically employed to ensure that conflicts between proposed layouts are resolved. Typically, the design review process involves review of text-based spreadsheet feedback or of paintbrush type markups. This review is cumbersome and prone to errors, as development engineers typically manually interpret and communicate feedback comments to ensure that they are implemented. These problems can be exacerbated when designers of the PCB board are geographically remote from each other. Accordingly, there is a need in the art for an improved technique for circuit board design.

BRIEF DESCRIPTION OF THE DRAWINGS

The present disclosure may be better understood, and its numerous features and advantages made apparent to those skilled in the art by referencing the accompanying drawings.

DETAILED DESCRIPTION

A design tool for printed circuit boards and methods thereof are disclosed. The design tool displays a graphical representation of a printed circuit board layout through a graphical user interface (GUI). Comments for particular components of the printed circuit board layout can be entered through the graphical user interface. The comments are stored in a data file associated with the printed circuit board layout. Comments can be entered and viewed by multiple users in real time. Comments can be displayed through the graphical user interface in proximity to the component associated with the comment, thereby improving the efficiency with which designers can review and implement suggested changes to the PCB layout.

Figure 1:
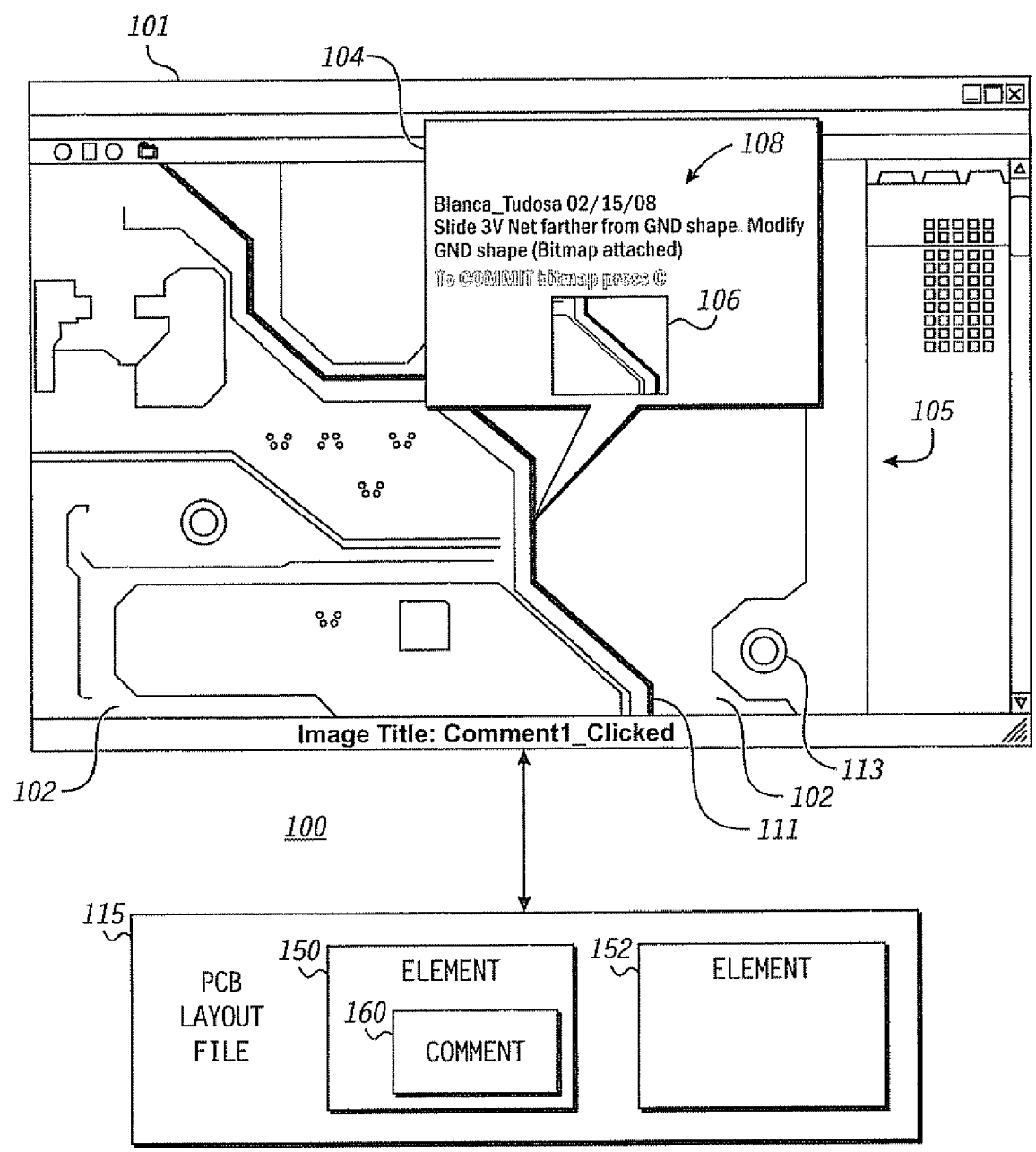
FIG. 1 is a diagram illustrating a particular embodiment of a graphical user interface.

Referring to FIG. 1, a particular embodiment of a system 100 for storing comments associated with a PCB layout is illustrated. The system 100 can be implemented via an information handling system. For purposes of this disclosure, an information handling system may include any instrumentality or aggregate of instrumentalities operable to compute, classify, process, transmit, receive, retrieve, originate, switch, store, display, manifest, detect, record, reproduce, handle, or utilize any form of information, intelligence, or data for business, scientific, control, entertainment, or other purposes. For example, an information handling system may be a personal computer, a PDA, a consumer electronic device, a network server or storage device, a switch router or other network communication device, or any other suitable device and may vary in size, shape, performance, functionality, and price. An information handling system may include memory, one or more processing resources such as a central processing unit (CPU) or hardware or software control logic. Additional components of an information handling system may include one or more storage devices, one or more communications ports for communicating with external devices as well as various input and output (I/O) devices, such as a keyboard, a mouse, and a video display. An information handling system may also include one or more buses operable to transmit communications between the various hardware components.

The system 100 includes a graphical user interface 101 and a PCB layout file 115. The PCB layout file 115 includes elements 150 and 152. Elements 150 and 152 include attribute data associated with components of PCB layout. As used herein, the term "component" refers a PCB layout feature, such as a wire or net, a hole, a location of an electronic component such as a resistor, capacitor, or integrated circuit, and the like.

Each of the elements 150 and 152 corresponds to a different component of the PCB layout. For example, the element 150 corresponds to a wire of the PCB layout, while the element 152 corresponds to a hole. Each of the elements 150 and 152 includes attribute data for its associated component, such as coordinates of the component, component dimensions, electrical values, and the like.

The GUI 101 accesses the PCB layout file 115 to provide a graphical display 105 of a portion of the PCB layout. The GUI 101 uses the attribute data in the elements 150 and 152 to display the associated components. In the illustrated example, the attribute data of the element 150 is used to display the wire 111, while the attribute data of the element 152 is used to display the hole 113.

The GUI 101 can include tools to allow a user to manipulate the graphical display 105 in order to change the displayed PCB layout. For example, the GUI 101 can provide a tool to allow a user to "drag" a displayed component to a different location. Other tools can allow a user to add or delete displayed components.

Changes to the layout displayed in the graphical display 105 are stored in the appropriate elements of the PCB layout file 115. For example, if the location of the wire 111 is changed, the attribute data of the element 150 is changed to reflect the change in location. Further, if new components are added via the GUI 101, associated elements are created in the PCB layout file 115. Similarly, if components are deleted, the associated elements can be removed from the PCB layout file 115.

The GUI 101 provides a tool that allows a user to enter comments for a component of the PCB layout. The tool can be invoked by selecting the component via a mouse click or other appropriate method. As illustrated, invocation of the comment tool causes the GUI 101 to display a comment window 104. The user can enter comment information 108 in the comment window 104 and the comment information 108 is stored as comment data 160 included in the element 150. Accordingly, the tool allows for a simple method of entering comment information for a particular component of a PCB layout.

In addition, the comment data 160 is displayed in the comment window 104. As illustrated, the comment data 160 can be displayed in proximity to the associated component (the wire 111). A visual indication can also be used to indicate which component is associated with the comment window 104. For example, the comment window 104 can include a callout, as illustrated, pointing to the associated component. The comment window 104 can also be displayed in a color that corresponds to a display color of the associated component. Because the comment data 160 is displayed via the comment window 104 in proximity to the associated component, and with the visual indications, a user of the GUI 101 can quickly determine which comment is associated with a particular component. This enhances the efficiency of a design review of the PCB layout represented by the PCB layout file 115. For example, a first user can enter the comment data 160 indicating a suggested change to the wire 111. A second user, performing a design review, can view the comment information 108 based on the comment data 160 in the comment window 104, and determine whether the suggested change should be implemented.

The comment window 104 also includes a graphical image 106 that allows for comment information to be entered in graphical, rather than textual format. The graphical image 106 can be a bitmap or other appropriate graphical image format, and can be stored as part of the comment data 160. The use of the graphical image 106 allows for proposed changes in the PCB layout to be displayed graphically, improving the efficiency of the design review process. In addition, the GUI 101 can include a tool that allows a user to "accept" or implement a particular comment. For example, the user can press a particular button or other input in order to have the change reflected in the graphical image 106 or the comment information 108 in the PCB layout file 115. This allows for suggested changes to be quickly and automatically implemented in the PCB layout file 115.

Figure 2:
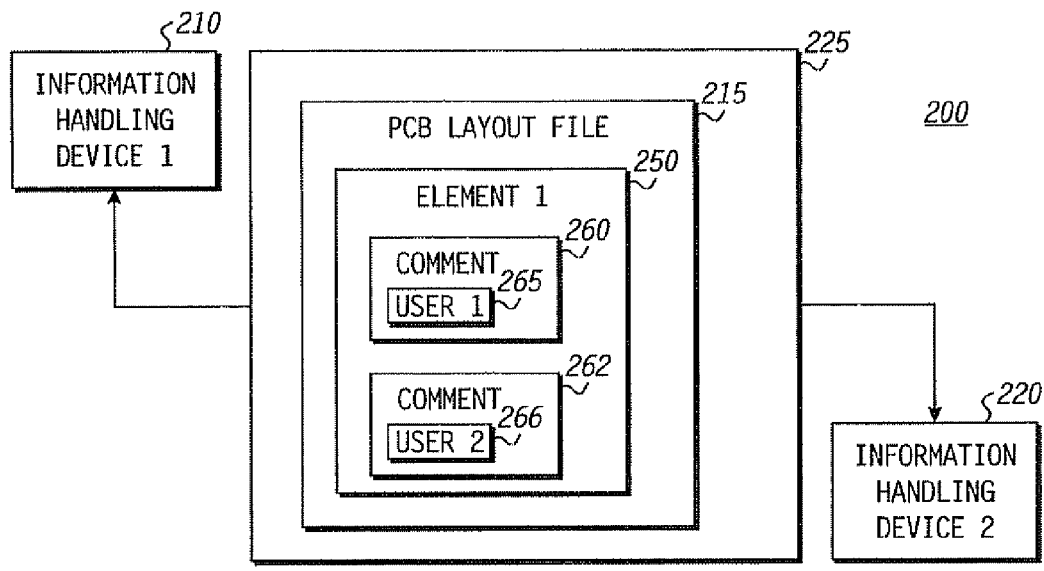
FIG. 2 is a block diagram of a particular embodiment of a computer network incorporating the graphical user interface of FIG. 1.

Referring to FIG. 2, a block diagram of a particular embodiment of a system 200 incorporating the GUI 101 of FIG. 1 is illustrated. The system 200 includes an information handling system 210 and an information handling system 220. The information handling systems 210 and 220 can be desktop computers, workstations, laptops, handheld computing devices, and the like. The information handling systems 210 and 220 are each connected to a server 225 via a network. The network can be a wide area network, such as the Internet, a local area network, and the like. In a particular embodiment, the information handling systems 210 and 220 are geographically remote from each other.

The server 225 stored a PCB layout file 215, corresponding to the PCB layout file 115 of FIG. 1. Each of the information handling systems 210 and 220 implement the GUI 101 to access the PCB layout file 215. Accordingly, each of the information handling systems 210 and 220 can simultaneously display the graphical display 105 to show the PCB layout. Further, users at the information handling system 210 and the information handling system 220 can simultaneously enter comment information for a PCB layout component via a comment window, and have the comment information displayed at both information handling systems 210 and 220. Accordingly, comment information can be entered and displayed by multiple users in real time, allowing for more rapid and efficient design review of a PCB layout, even where members of a design team are located in different physical locations.

Comment information for the wire 111 entered by each user is stored in the element 250 of the PCB layout file 215. For example, comment information entered by a user at the information handling system 210 is stored as comment data 260, while comment information entered by a user at the information handling system 220 is stored as comment data 262. Comment data 260 includes user information 265 to indicate which user entered the associated comment information. Similarly, comment data 262 includes user information 266. The user information 265 and 266 can be displayed in the comment window 104 together with the associated comment information, thereby allowing users at different information handling systems in a network to determine which user entered particular comment information.

It will be appreciated that FIG. 2 illustrates only one possible network configuration, and that other configurations are possible. For example, one of the information handling systems 210 or 220 could perform as a server, and store the PCB data file 215. In an alternative embodiment, the information handling systems 210 and 220 are connected via a peer-to-peer network, and the PCB data file 215 is stored at one of the devices, or shared between them.

Figure 3:
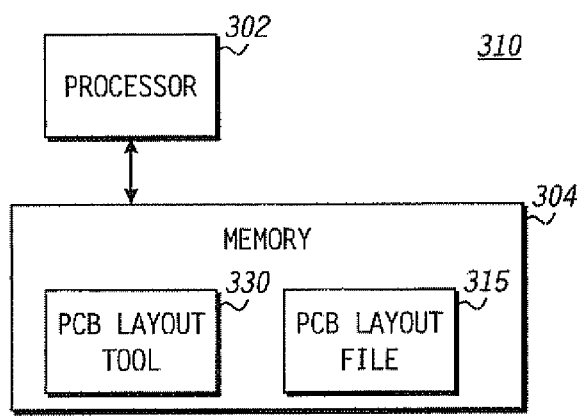
FIG. 3 is a block diagram of a particular embodiment of an information handling system of FIG. 2.

Referring to FIG. 3, a block diagram of a particular embodiment of an information handling system 310, corresponding to the information handling system 215 of FIG. 2, is illustrated. The information handling system 310 includes a processor 302 and a memory 304. The processor 302 can be a microprocessor, microcontroller, application specific integrated circuit (ASIC) and the like. The memory 304 is a computer readable medium that can be volatile memory, such a random access memory (RAM), or non-volatile memory, such as a hard disk, flash memory, read only memory, and the like.

The memory 304 is accessible by the processor 302, and stores a PCB layout file 315 and a PCB layout tool 330. The PCB layout tool 330 includes instructions to manipulate the processor 304 to perform various functions, including instructions to implement the GUI 101. Further, the PCB layout tool can include instructions to manipulate the processor 302 to perform any of the methods disclosed herein.

Figure 4:
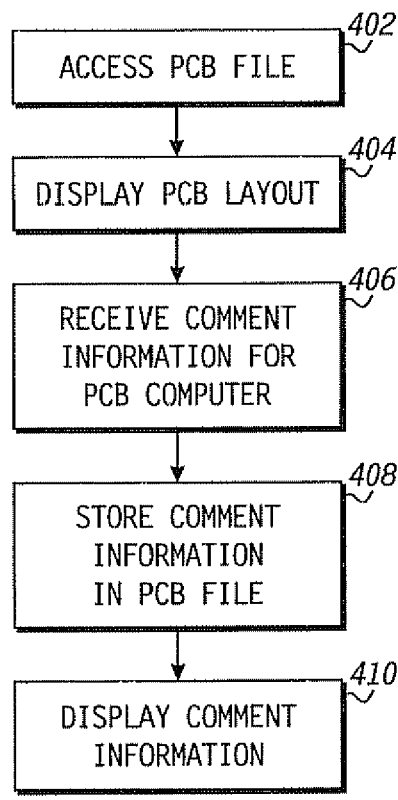
FIG. 4 is a flow diagram of a particular embodiment of a method of storing comments for a printed circuit board layout.

Referring to FIG. 4, a flow diagram of a particular embodiment of a method of storing comment information for a printed circuit board layout is illustrated. At 402, a PCB layout file is accessed. At 404, a graphical user interface displays the PCB layout based on the PCB layout file. The PCB layout can be displayed at multiple information handling systems for multiple users. For example, the PCB layout can be displayed via the GUI at multiple information handling systems in a network.

At block 406, comment information associated with a PCB component is received. The comment information can be entered by a user at an information handling system implementing the GUI. The comment information can be text-based, a graphical image, or a combination thereof. At block 408, the comment information is stored in the PCB file. In a particular embodiment, the comment information is stored as attribute data associated with the component corresponding to the comment information. At block 410, the comment information is displayed via the GUI. The comment information can be displayed for multiple users, so that comments can be both entered and displayed in real-time, allowing for efficient review and implementation of comments.

Figure 5:
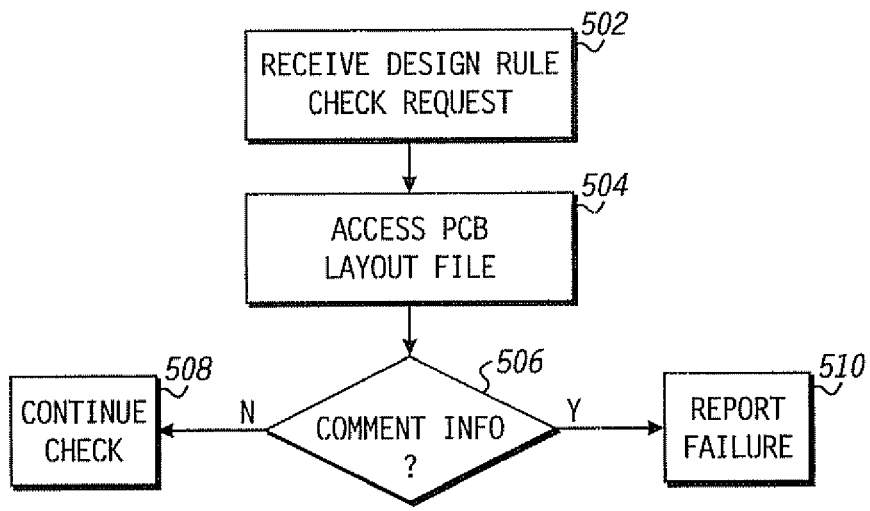
FIG. 5 is a flow diagram of a particular embodiment of a method of performing a design rule check for a printed circuit board layout.

Referring to FIG. 5, a flow diagram of a particular embodiment of a method of performing a design rule check for a PCB layout is illustrated. At block 502, a design rule check request for a PCB layout file is received. The request can be received via a graphical user interface, such as the GUI 101 of FIG. 1. At block 504, the PCB layout file 504 is accessed. The PCB layout file includes information for components of the PCB layout so that the design rule check can determine if the layout complies with the design rules.

At block 506, it is determined whether comment information is associated with any component of the PCB layout based on the data stored in the PCB layout file. If comment information is associated with a component, the method flow moves to block 510 and the design rule check reports a check failure. Other information can also be reported, such as an indication that the design rule check failed due to the presence of a comment, the component associated with the comment, and other appropriate information. If no comments are found in the PCB layout file, the method flow moves to block 508 and the design rule check continues by comparing the PCB layout file data with other design rules. For example, the design rule check can determine whether the coordinates and dimensions of each component comply with the design rules.

Although only a few exemplary embodiments have been described in detail above, those skilled in the art will readily appreciate that many modifications are possible in the exemplary embodiments without materially departing from the novel teachings and advantages of the embodiments of the present disclosure. Accordingly, all such modifications are intended to be included within the scope of the embodiments of the present disclosure as defined in the following claims. In the claims, means-plus-function clauses are intended to cover the structures described herein as performing the recited function and not only structural equivalents, but also equivalent structures.

What is claimed is:

1. A method, comprising:
   accessing a data file associated with a printed circuit board layout, the data file comprising a plurality of elements corresponding to components of the printed circuit board layout;
   displaying at a graphical user interface a graphical representation of a portion of the printed circuit board layout based on the data file; and
   storing at a computer device first comment information received at the graphical user interface while the graphical representation of the portion of the printed circuit board layout is being displayed, the first comment information associated with a first element of the plurality of elements, the first comment information indicative of a comment entered by a first user.

2. The method of claim 1, further comprising storing second comment information received at the graphical user interface, the second comment information associated with the first element of the plurality of elements.

3. The method of claim 2, wherein the second comment information comprises information entered by a second user.

4. The method of claim 2, further comprising:
   receiving the first comment information from a first information handling system; and
   receiving the second comment information from a second information handling system, the second information handling system remote from the first information handling system.

5. The method of claim 4, wherein the first comment information and the second comment information are received simultaneously.

6. The method of claim 1, further comprising storing second comment information received at the graphical user interface, the second comment information associated with a second element of the plurality of elements.

7. The method of claim 1, further comprising providing an interface to receive the first comment information via the graphical user interface.

8. The method of claim 1, further comprising displaying the first comment information together with a graphical representation of a suggested change in the first element simultaneously with displaying the first element.

9. The method of claim 1, further comprising:
   receiving a design rule check request associated with the data file; and
   reporting a design rule error in response to determining the first comment is stored in the data file.

10. The method of claim 1, further comprising:
    displaying the first comment information.

11. The method of claim 10, wherein the first comment information is received from a first information handling system, and the first comment information is displayed at a second information handling system located remotely from the first information handling system.

12. The method of claim 10, wherein displaying the comment information comprises displaying the comment information with a visual indication of a graphical representation of a component of the printed circuit board associated with the first element.

13. The method of claim 1, further comprising displaying via the graphical user interface a first visual characteristic in response to storing the first comment information, the first visual characteristic associated with a display of a component of the printed circuit board layout associated with the first element.

14. A computer readable medium comprising a plurality of instructions to manipulate a processor, the plurality of instructions comprising:
    instructions to access a data file associated with a printed circuit board layout, the data file comprising a plurality of elements corresponding to components of the printed circuit board layout;
    instructions to display at a graphical user interface a graphical representation of a portion of the printed circuit board layout based on the data file; and
    instructions to store first comment information received at the graphical user interface while the graphical representation of a portion of the printed circuit board layout is being displayed, the first comment information associated with a first element of the plurality of elements.

15. The computer readable medium of claim 14, further comprising instructions to store second comment information received at the graphical user interface, the second comment information associated with the first element of the plurality of elements.

16. The computer readable medium of claim 15, wherein the first comment information comprises information associated with a first user and the second comment information comprises information associated with a second user.

17. The computer readable medium of claim 15, further comprising:

instructions to receive the first comment information from a first information handling system; and instructions to receive the second comment information from a second information handling system, the second information handling system remote from the first information handling system.

18. The computer readable medium of claim 17, wherein the first comment information and the second comment information are received simultaneously.

19. The computer readable medium of claim 14, further comprising instructions to store second comment information received at the graphical user interface, the second comment information associated with a second element of the plurality of elements.

20. The computer readable medium of claim 14, further comprising instructions to provide an interface to receive the first comment information via the graphical user interface.

* * * * *